United States Patent
Veis

(10) Patent No.: US 10,448,459 B2
(45) Date of Patent: Oct. 15, 2019

(54) LIGHT EMITTING DIODE HEAT SINK

(71) Applicant: HP SCITEX LTD., Netanya (IL)

(72) Inventor: Alex Veis, Kadima (IL)

(73) Assignee: HP SCITEX LTD., Netanya (IL)

( * ) Notice: Subject to any disclaimer, the term of this patent is extended or adjusted under 35 U.S.C. 154(b) by 0 days.

(21) Appl. No.: 16/259,464

(22) Filed: Jan. 28, 2019

(65) Prior Publication Data

US 2019/0159290 A1 May 23, 2019

Related U.S. Application Data

(63) Continuation of application No. 15/681,744, filed on Aug. 21, 2017, now Pat. No. 10,201,041.

(30) Foreign Application Priority Data

Sep. 30, 2016 (EP) ..................................... 16191956

(51) Int. Cl.
*H05B 3/00* (2006.01)
*F27D 11/12* (2006.01)
(Continued)

(52) U.S. Cl.
CPC ............ *H05B 3/009* (2013.01); *B41J 11/002* (2013.01); *F27D 11/12* (2013.01); *H05B 3/0033* (2013.01);
(Continued)

(58) Field of Classification Search
CPC ........ F21V 29/51; F21V 29/67; F21V 29/673; F21V 29/767; F21V 29/004; F21V 29/006; F21V 29/83; F21V 29/677; F21V 29/71; F21V 29/713; F21V 29/717; F21V 29/763; F21V 29/80; F21V 15/01; F21V 23/005; F28F 1/32; F28F 1/12; F28F 1/24; F28F 1/02; F28F 1/04; F28F 1/14; F28F 1/20; F28F 1/30; F28F 13/06; F28F 21/084; F28F 21/085; F28F 2210/10; F28F 2215/10; F28F 2250/08; F28F 2275/085; F28F 2275/10; H01L 2924/0002; H01L 2924/00; H01L 2924/00014; H01L 23/427; H01L 23/467; H01L 23/367; H01L 23/4006;
(Continued)

(56) References Cited

U.S. PATENT DOCUMENTS 4,238,759 A * 12/1980 Hunsperger ............ H01L 23/38
257/712
5,481,339 A 1/1996 De Cock et al.
(Continued)

FOREIGN PATENT DOCUMENTS

CN 1678252 10/2005
CN 101128930 2/2008
(Continued)

*Primary Examiner* — David A Vanore
(74) *Attorney, Agent, or Firm* — HP Inc. Patent Department

(57) ABSTRACT

In some examples, a heating apparatus includes a light emitting diode (LED) array comprising an LED to heat a target object, and a heat sink thermally coupled to the LED array, to dissipate heat from the LED array, the heat sink comprising a plurality of refrigerant paths to pass a refrigerant through the heat sink in a plurality of different directions.

20 Claims, 7 Drawing Sheets

(51) Int. Cl.
*F28D 15/02* (2006.01)
*H05K 7/20* (2006.01)
*B41J 11/00* (2006.01)

(52) U.S. Cl.
CPC ....... *H05B 3/0066* (2013.01); *H05K 7/20254* (2013.01)

(58) Field of Classification Search
CPC ......... H01L 25/0753; H01L 2224/0401; H01L 2224/16225; H01L 2224/73253
USPC ... 165/104.21, 104.33, 80.3, 185, 80.2, 151, 165/181, 67; 361/700, 697, 703, 704, 361/709, 719, 679, 679.52, 679.54, 701, 361/710
See application file for complete search history.

(56) References Cited

U.S. PATENT DOCUMENTS

| | | | | |
|---|---|---|---|---|
| 6,113,212 A * | 9/2000 | Ng | ............... | B41J 29/377 347/18 |
| 6,463,743 B1 * | 10/2002 | Laliberte | ............. | F25B 21/04 62/3.3 |
| 6,469,894 B2 * | 10/2002 | Ubukata | ............ | H01L 23/4006 165/104.33 |
| 6,607,259 B2 * | 8/2003 | Mott | ............... | B41J 2/1408 347/18 |
| 6,683,421 B1 * | 1/2004 | Kennedy | ............ | B29C 35/0288 315/149 |
| 6,945,319 B1 * | 9/2005 | Li | ............... | F28D 15/0275 165/104.33 |
| 7,025,125 B2 * | 4/2006 | Sheng | ............... | F28D 15/0233 165/104.21 |
| 7,028,758 B2 * | 4/2006 | Sheng | ............... | F28D 15/0275 165/104.21 |
| 7,165,603 B2 * | 1/2007 | Mochizuki | ............ | F28D 15/02 165/104.21 |
| 7,304,847 B2 * | 12/2007 | Hwang | ............... | F28F 1/30 165/104.33 |
| 7,469,111 B2 | 12/2008 | Reihl | | |
| 7,545,646 B2 * | 6/2009 | Holmberg | ........... | F28D 15/0266 165/80.2 |
| 7,983,043 B2 * | 7/2011 | Xu | ............... | F28D 15/0233 165/185 |
| 9,109,784 B2 * | 8/2015 | Lee | ............... | F21V 29/767 |
| 9,278,564 B2 | 3/2016 | Mauck et al. | | |
| 9,841,172 B2 * | 12/2017 | Watanabe | ............ | F21V 29/673 |
| 9,894,803 B1 * | 2/2018 | Artis | ............ | F28F 1/02 |
| 2004/0035558 A1 | 2/2004 | Todd | | |
| 2004/0135159 A1 | 7/2004 | Siegel | | |
| 2005/0092465 A1 | 5/2005 | Lin | | |
| 2006/0171801 A1 | 8/2006 | Manabe | | |
| 2009/0084529 A1 | 4/2009 | Huang | | |
| 2010/0220141 A1 | 9/2010 | Ozawa | | |
| 2011/0100604 A1 * | 5/2011 | Anzai | .................... | B21D 53/08 165/104.21 |
| 2011/0204261 A1 | 8/2011 | Dahm et al. | | |
| 2012/0061054 A1 * | 3/2012 | Katz | .................... | F21V 29/006 165/80.2 |
| 2012/0098401 A1 * | 4/2012 | Yu | ............... | F28D 15/0275 313/46 |
| 2015/0029658 A1 * | 1/2015 | Yairi | ............... | G06F 1/20 361/679.47 |
| 2015/0138830 A1 * | 5/2015 | Yu | ............... | F28D 15/043 362/609 |
| 2015/0276196 A1 * | 10/2015 | Uchida | ............... | B41J 11/002 347/102 |
| 2016/0146447 A1 * | 5/2016 | Leeper | ............... | F21V 29/51 362/373 |
| 2016/0348887 A1 * | 12/2016 | Kobayashi | ............ | B41J 11/002 |
| 2017/0197001 A1 * | 7/2017 | Shito | ............... | A61L 2/10 |
| 2017/0254574 A1 * | 9/2017 | Kim | ............... | F25B 49/02 |
| 2017/0284650 A1 * | 10/2017 | Watanabe | ............ | F21V 29/713 |

FOREIGN PATENT DOCUMENTS

| | | |
|---|---|---|
| CN | 103348185 | 10/2013 |
| CN | 204604906 U | 9/2015 |
| JP | 2009064986 A | 3/2009 |

* cited by examiner

LIGHT EMITTING DIODE HEAT SINK

CROSS REFERENCE TO RELATED APPLICATIONS

This application is a continuation of U.S. application Ser. No. 15/681,744, filed Aug. 21, 2017, which claims the benefit of EP Application No. 16191956.8. filed Sep. 30, 2016, which are both hereby incorporated by reference.

BACKGROUND

In an example printing apparatus, printing materials, such as ink, resin, plastics or powders may be subjected to heat. For example, in an inkjet printer, ink fluid is deposited on a substrate. Heat may be applied to the printed substrate to evaporate a liquid component of the ink, such as water and/or solvent, to dry the printed substrate. In some examples the printed substrate is subjected to hot air or radiation emitted from an illumination source. The same may apply to the drying of three-dimensional (3-d) printed objects.

BRIEF DESCRIPTION OF THE DRAWINGS

Various features and advantages of the present disclosure will be apparent from the detailed description which follows, taken in conjunction with the accompanying drawings, which together illustrate, by way of example only, features of the present disclosure, and wherein.

DETAILED DESCRIPTION

In the following description, for purposes of explanation, numerous specific details are set forth in order to provide a thorough understanding of the present apparatus, systems and methods. It will be apparent, however, that the present apparatus, systems and methods may be practiced without these specific details. Reference in the specification to "an example" or similar language means that a particular feature, structure, or characteristic described in connection with the example is included in at least that one example, but not necessarily in other examples.

LEDs may be used evaporate fluid. For example, a substrate on which ink has been deposited may be dried using LEDs. Some LEDs are sensitive to operation temperature. Reference to the operating temperature of an LED includes the operating temperature of the junction in the semiconductor of the LED. Heat may be generated in the vicinity of the semiconductor junction as a result of the recombination of electrons and holes that occurs during LED operation.

The lifetime of an example LED is inversely proportional to the LED operating temperature. Therefore, as the LED operating temperature increases, the lifetime of the LED decreases. Additionally, the output of an LED may vary as a function of the LED operating temperature. For example, the output of the LED increases as the LED operating temperature is decreased. Therefore, the LED irradiance [$W/m^2$] may be higher at a certain operating temperature than the irradiance at a relatively higher operating temperature.

To extend the lifetime of an LED, and therefore reduce the costs associated with replacing the LED, the operating temperature of the LED may beneficially be decreased. Similarly, to increase the power output of the LED, the operating temperature of the LED may be decreased. These effects may be accomplished by proper thermal management of the LED. In some examples, the LEDs may operate at temperatures below 0 degrees Celsius. At −10 degrees Celsius for example, a typical LED can emit 50% to 100% more light without damaging the respective LED.

Some commercially available LED-based heating apparatus are cooled using air or water. However air cooling and water cooling each have an inherent limitation of above ambient temperature operation. For example, in general air cooled systems operate at around ambient temperature or above. Water cooled systems cannot operate below zero degrees Celsius without freezing, without the addition and associated cost of anti-freeze.

In some commercially available LED-based heating products, air and water may be cooled using refrigeration systems. However these commercially available products can be bulky and expensive. Lower cost, less bulky, more efficient apparatus is needed to cool LEDs.

Figure 1:
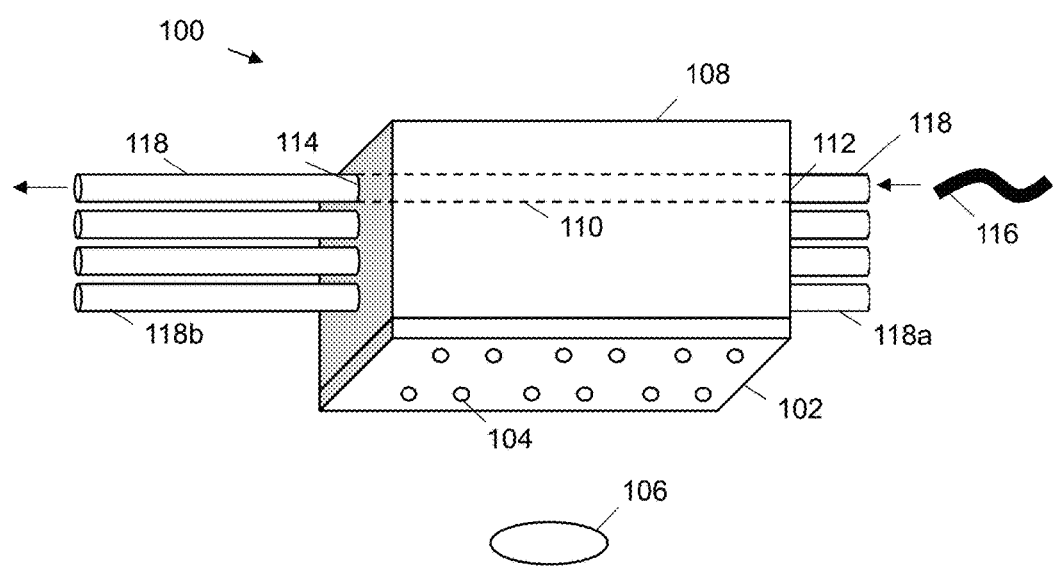
FIG. 1 is a schematic diagram of a heating apparatus in accordance with an example.

FIG. 1 shows an example heating apparatus 100 comprising a light emitting diode (LED) array 102 where the LED array 102 comprises at least one LED 104 to heat a target object 106. In this example, the LED array is shown to have 12 LEDs 104, although any other practical number can be accommodated. The heating apparatus 100 also comprises a heatsink 108, which is thermally coupled to the LED array 102. The heatsink 108 acts to dissipate heat from the LED array 102. The example heatsink 108 comprises a refrigerant path 110 including an input 112 to the refrigerant path 110 and an output 114 from the refrigerant path 110. Cooled refrigerant 116 may be passed through the refrigerant path 110. In one example, the heating apparatus 100 is part of a printing device.

In the example of FIG. 1, a target object 106 may be heated by one or more of the LEDs 104 in the LED array 102. In one example, the target object 106 comprises a substrate on which fluid, such as ink, has been deposited. For example, ink may have been printed onto a print substrate. In another example, the target object 106 may be an object printed by a 3-d printer device. In either case, the LED array 102 applies heat to the target object 106. Additional sources of heat may also be applied to the target object 106. Example LEDs 104 may emit radiation in the UV, UVA, or visible spectrum, however the LEDs 104 may emit any wavelength radiation. In some examples the LEDs 104 emit IR radiation.

By coupling the LED array 102 to the heatsink 108, the temperature of the LEDs 104, and therefore the LED array 102, can be reduced. As mentioned, this can increase the lifetime of the LEDs 104.

As well as being thermally coupled, the LED array 102 and the heatsink 108 may also be mechanically coupled. Furthermore, the LED array 102 and the heatsink 108 may be directly coupled or indirectly coupled. The LED array 102 may, for example, be bonded to the heatsink with thermally conductive adhesive, attached with fasteners such as screws or coupled in any other appropriate manner. In one example, one or more components (not shown) may reside between the LED array 102 and the heatsink 108. The components may be good conductors of heat, such as thermal grease, or adhesive, to allow heat to be transferred between the LED array 102 and the heatsink 108. In one example, the heatsink may be a block of metal, such as aluminum or copper, or it can be made of any other material that allows heat to dissipate from the LED array 102.

In one example the LED array 102 may be a Chip on Board (COB) structure.

The heatsink 108 may comprise one or more refrigerant paths 110. Refrigerant 116 can be passed through the one or more refrigerant paths 110. In an example, the refrigerant 116 is at a lower temperature than the temperature of the heatsink 108 during operation. The refrigerant 116 may be cooled by any suitable means, for example by a refrigeration system 402, depicted in FIG. 4. The cooled refrigerant 116 is passed through, or along, the refrigerant paths 110 such that heat from the heatsink 108 is transferred to the cooled refrigerant 116. Thus heat from the LED array 102 is transferred to the cooled refrigerant 116 via the heatsink. Thus the LEDs 104 can be maintained at desired temperatures.

The refrigerant path 110 comprises an input 112 and an output 114, where the refrigerant 116 flows into the refrigerant path 110 via the input 112 and out of the refrigerant path via the output 114.

A refrigerant is a fluid used in a refrigeration cycle. Examples may include fluorocarbons, ammonia, Sulphur dioxide and propane, however any suitable refrigerant may be used.

In the example heating apparatus 100, the heatsink 108 comprises four refrigerant paths 110, which pass through the heatsink 108. For illustrative purposes, only one refrigerant path is shown with dashed lines as passing through the heatsink. It is to be appreciated that any number of refrigerant paths 110 may be provided in the heatsink 108.

In the example heating apparatus of FIG. 1, the refrigerant path 110 comprises a through hole formed in the heatsink 108. In other words, the refrigerant path 110 is a through hole through which cooled refrigerant 116 can pass. In one example, the through hole may be formed by drilling in the heatsink 108. In the example apparatus 100, the through hole passes straight through the heatsink 108, although any form may be taken. For example the heatsink may be formed so that a through hole may curve, or zig-zag, multiple times within the heatsink 108. In another example, a refrigerant path 110 may be formed by providing a helical through hole in the heatsink 108. Regardless of the path taken, refrigerant 116 is passed through the heatsink 108 (i.e. the refrigerant path 110) to cool the LEDs 104.

Refrigerant 116 may be passed directly through the heatsink 108, such that the refrigerant is in direct contact with a surface of the refrigerant path 110 formed in the heatsink 108. In another example, the refrigerant may pass through the refrigerant path (and therefore the heatsink) via a conduit 118. The example heating apparatus 100 may therefore further comprise a conduit 118 to receive the cooled refrigerant 116, where the cooled refrigerant 116 is to pass through the refrigerant path 110 via the conduit 118.

The conduit 118 may be a single component that passes through the refrigerant path 110, or may comprise one or more separate components 118a and 118b. In one example, the conduit 118 may be a single conduit 118 that passes through the heatsink 108. An outer surface of the conduit 118 is thermally coupled to a surface of the heatsink. The refrigerant 116 therefore can flow along the conduit 118, and along the refrigerant path 110, to remove heat from the heatsink 108. In another example, the conduit 118 may comprise two components such as conduit 118a and 118b. Conduit 118a may terminate at the surface of the heatsink 108, such as at the input 112. Therefore the conduit 118a does not pass substantially into the heatsink 108. Similarly, conduit 118b may begin at the output 114 of the heatsink 108. Refrigerant passes through the conduit 118a, into the heatsink 108, and exits the heatsink via conduit 118b. Any other suitable configurations for passing cooled refrigerant through/along the refrigerant paths 110 may be provided.

The conduit 118 may be of any shape. In the example of FIG. 1, the conduit 118 is cylindrical, however it may also be rectangular, square, or elliptical in cross-section. The cross section of the conduit 118 may be constant, or vary along its length.

FIGS. 2A-D depict various flow routes that the refrigerant may take through the heatsink 108.

Figure 2A:
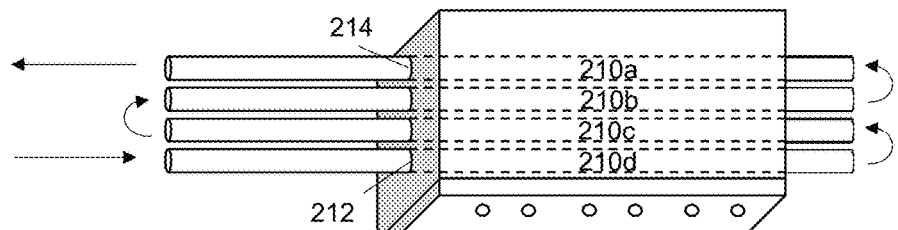
FIGS. 2A-D are schematic diagrams of exemplary refrigerant flows through an example heating apparatus.
Figure 2B:
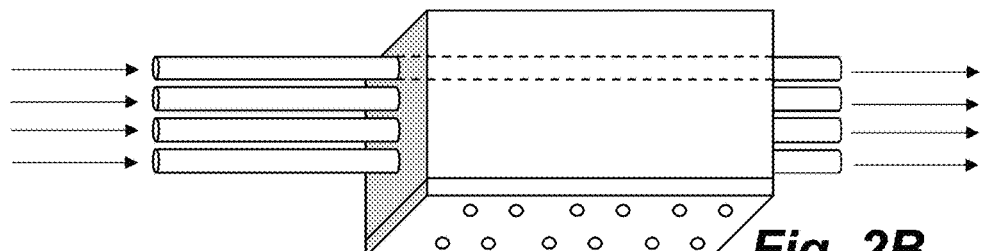
Figure 2C:
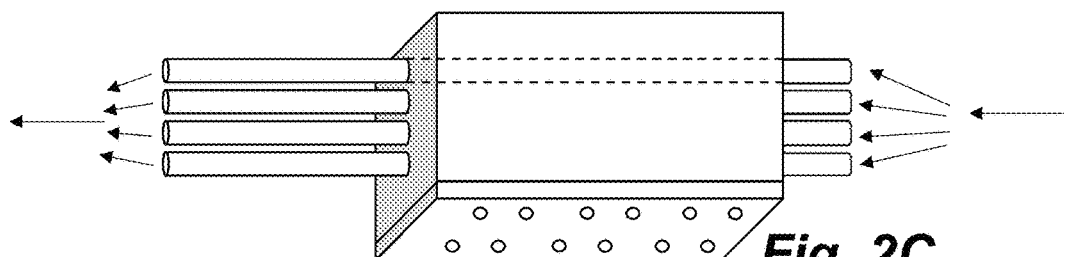
Figure 2D:
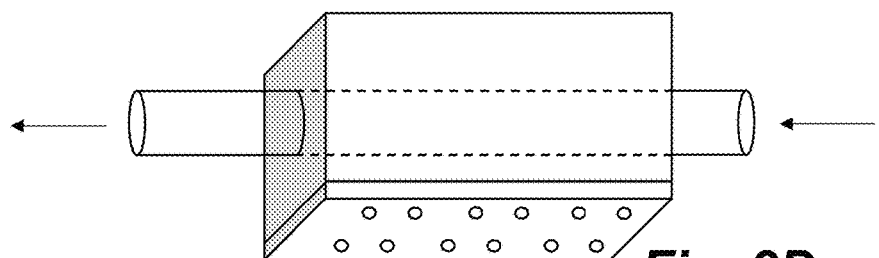

In FIG. 2A, a continuous, serpentine refrigerant path passes back and forth through the heatsink four times, so that refrigerant in the path flows through the heatsink 108 four times. In this example there is only one open input 212 and one open output 214 to the refrigerant path 110 (which may be said to comprise routes 210a, 210b, 210c and 210d). In another example, not shown in FIG. 2A, the refrigerant 116 may stay within the heatsink between the input 212 and output 214, and it does not flow out of the heatsink in a section of exposed conduit as it reverses the direction of flow. In FIG. 2B, refrigerant 116 is shown to flow simultaneously in one direction (i.e. from left to right) through multiple refrigerant paths 110. In FIG. 2C, separate flows of refrigerant 116 are shown to pass through the refrigerant paths 110 by splitting a single flow, for example by using an input manifold (not shown) to split one path into plural paths. The separate flows may then later re-combine into a single flow, for example by using an output manifold (not shown) to combine plural paths to one path. In FIG. 2D, a singular, larger cross-section refrigerant path 110 is shown as an alternative configuration.

Figure 3A:
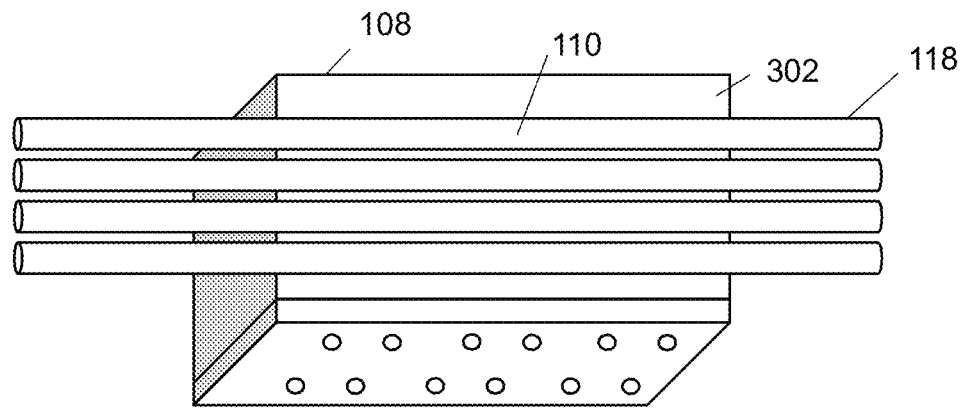
FIG. 3A is a schematic diagram of a heating apparatus comprising one or more channels in accordance with an example.
Figure 3B:
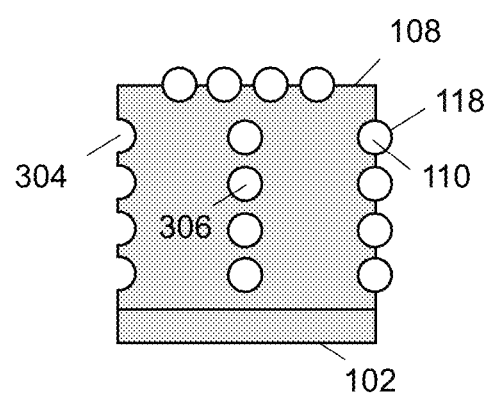
FIG. 3B is a side elevation of a heating apparatus comprising one or more channels and one or more through holes in accordance with an example.

In FIGS. 3A and 3B, one or more of the refrigerant paths 110 are depicted as being channels 304 formed in the heatsink 108. FIG. 3B depicts an end view of the heatsink 108. On the left hand side, four channels 304 are shown to have been formed in a surface of the heatsink 108, thereby forming four refrigerant paths 110. On the right hand side, four further channels 304 are shown to have been formed and a conduit 118 has been inserted into each of the channels 304. The conduits 118 can be seen depicted in FIG. 3A, which shows a side view of the same heatsink 108. At least a portion of the conduit 118 is thermally coupled to the heatsink 108. Cooled refrigerant 116 can pass along/through the refrigerant paths 110 (and therefore along/through the channels) via the conduits 118. In FIG. 3B, the example heatsink 108 comprises both through holes 306 and channels 304. A combination of these features may be used to further decrease the temperature of the LED array 102 in operation, or to maximize the efficiency of cooling the LED array 102. The channels 304 can allow the contact surface area between the refrigerant 116 (or conduit 118 comprising the refrigerant 116) to be increased, therefore increasing the efficiency of removing heat from the heatsink 108.

Figure 4:
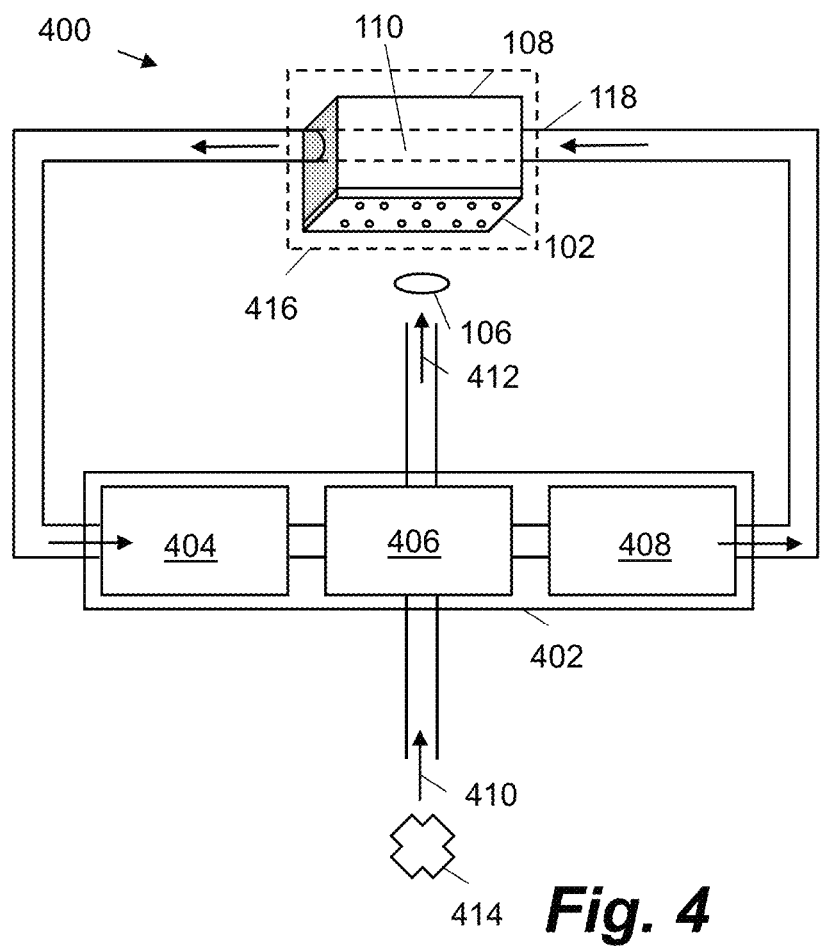
FIG. 4 is a schematic diagram of apparatus comprising a refrigeration system in accordance with an example.

FIG. 4 depicts an example apparatus 400 comprising an LED array 102, which includes at least one LED 104 to heat a target object 106. The apparatus 400 further comprises a heatsink 108, which is thermally coupled to the LED array 102. The heatsink 108 comprises at least one refrigerant path 110. The apparatus also comprises a refrigeration system 402 configured to cool a refrigerant within the refrigeration system 402 and pass the cooled refrigerant 116 through the at least one refrigerant path 110 such that heat from the LED array 102 is transferred to the cooled refrigerant 116 via the heatsink 108.

The refrigeration system 402 may be a standard refrigeration system or a standard air conditioning system. Only moderate modifications may be required to adapt these standard systems for use in the apparatus 400. Typically, standard refrigeration and air conditioning systems cost less than industrial chillers that may be employed to cool LEDs 104.

Standard air conditioning systems are often used to cool air using the cooled refrigerant 116, and the cooled air may then be used to cool LEDs. It is perceived that the use of air as a cooling medium increases the cost of apparatus comprising the refrigeration system. It may also mean that such apparatus is relatively bulky. Furthermore, the transfer of energy between the refrigerant 116, air, and LEDs 104 is perceived to be relatively inefficient. Examples herein obviate the intermediate step of cooling air to cool LEDs, and are therefore perceived to provide a more efficient method of cooling the LEDs 104. The apparatus 400 forgoes the need to cool air in this manner.

The apparatus 400 in FIG. 4 depicts just one refrigerant path 110, however there may be more than one refrigerant path 110. In addition, any feature discussed in relation to FIGS. 1-3 may alternatively, or in addition, be included in the apparatus 400. Similarly, features discussed in relation to FIG. 4 may alternatively, or in addition, be included in the heating apparatus 100 discussed in FIGS. 1-3. For example, the heating apparatus 100 may further comprise the features of the refrigeration system 402.

In one example, the refrigeration system 402 comprises a compressor 404 configured to compress at least a portion of the refrigerant, a condenser 406 configured to condense at least a portion of the refrigerant, and an expansion valve 408 configured to decrease the pressure of at least a portion of the refrigerant, thereby cooling the refrigerant. The refrigeration system 402 cools the refrigerant 116 that is supplied to the heating apparatus 100. For example, the cooled refrigerant 116 flows from the refrigeration system 402 through the one or more refrigerant paths 110 in the heatsink 108. The cooled refrigerant 116 may flow from the refrigeration system 402 to the heatsink 108 via the one or more conduits 118.

The apparatus 400 may further comprise the at least one conduit 118, and the refrigeration system 402 may be configured to pass the cooled refrigerant 116 through the at least one refrigerant path 110 via the at least one conduit 118. Heat from the heatsink 108 is transferred to the cooled refrigerant 116 via the at least one conduit 118. For example, heat passes from the heatsink 108 to the refrigerant 116 by passing through an outer wall of the conduit 118. A surface of the conduit 118 may be in contact with the heatsink 108.

In the refrigeration system 402, the refrigerant may begin its cycle as a cool vapour at relatively low pressure. For example, the cycle begins as the refrigerant enters the compressor 404. Once the refrigerant enters the compressor 404 it is compressed to a relatively higher pressure, which increases the temperature of the refrigerant. The resulting hot, compressed gas is then passed into the condenser 406. In the condenser 406, the refrigerant is condensed. Condensation can occur in a known way by passing relatively cooler water or air across tubes through which the refrigerant flows. In one example, air, such as ambient air from the environment, enters the condenser 406 to condense the refrigerant to a condensed, compressed liquid. Heat is transferred from the refrigerant to the air and the air is heated.

The condensed, compressed refrigerant is passed into the expansion valve 408. In the expansion valve 408, the refrigerant decreases in pressure and expands, which decreases the temperature of the refrigerant. The refrigerant 116 is thereby cooled. As the cooled refrigerant 116 flows through the refrigerant paths 110, heat from the LED array 102 is transferred to the cooled refrigerant 116 via the heatsink 108. The operating temperature of the LEDs 104 therefore decreases and the temperature of the refrigerant increases. Part, or all of the cooled refrigerant 116 may be evaporated as it increases in temperature within the refrigerant path 110. After passing through the refrigerant paths 110, the refrigerant can flow back into the condenser 404 to repeat the cycle.

In operation of the system 400, after one or more cycles of the cooled refrigerant 116, and after a certain length of time, the LEDs 104 may reach a steady state operating temperature. The steady state temperature may be selected from a range of desired temperatures. For example the temperature may be 16 degrees, or 0 degrees. The system may act to cool the LEDs 104 to this selected temperature, and, once this temperature is achieved, maintain the LEDs 104 at that temperature during operation.

The refrigeration system 402 may in addition be configured to supply a flow of air 410 to the condenser 406 to heat the flow of air 410, and supply the heated flow of air 412 to the target object 106. The air 410 may be drawn, or blown, into the condenser 406 by one or more fans 414. The heated flow of air 412 may be used as an additional means for drying/heating the target object 106. The flow of air 410, as explained above, removes heat from the condenser 406 where the refrigerant condenses before entering the expansion valve 408.

The heated air 412 may be selectively applied to the target object 106. For example, a controller may determine when to direct the heated air 412 to the target object 106. This may be dependent on the target object 106, or a temperature measured within the vicinity of the target object 106. In an example, the temperature within the vicinity of the target object 106 falls below a certain threshold, so the flow of heated air 412 may be directed toward the target object 106. In another example, when the temperature within the vicinity of the target object increases above a threshold, the heated air 412 is directed away from the target object 106. In an example, the humidity of the heated air 412 may also be controlled before being applied to the target object 106.

In some examples, the heated air 412 may not be applied to the target object, and may instead be expelled to the environment In one example, the heatsink 108 may be thermally isolated from the environment. Thermal isolation is depicted in FIG. 4 by element 416. Element 416 may be an insulating material, that limits, or substantially reduces thermal coupling between the heatsink 108 and the environment. Thermal isolation may help prevent condensation while working at lower temperatures, for example below 16 degrees Celsius, or below zero degrees Celsius. This condensation could come into contact with electronic components or other elements, such as the target object 106. Furthermore, thermally isolating the heatsink 108 can improve the heatsink's efficiency because it limits the amount of heat the heatsink 108 can absorb from the environment. In one example thermally isolating the heatsink 108 from the environment means that the heatsink 108 may be thermally isolated from other components within the apparatus 400 other than the LED array 102 and the cooled refrigerant 116. For example, where the apparatus 400 is used within a printer, the heatsink 108 may be thermally isolated from other elements inside the printer. In another example thermally isolating the heatsink 108 from the environment means that the heatsink 108 may be thermally isolated from the outside of the apparatus 400. For example, where the apparatus 400 is used within a printer, the heatsink 108 may be thermally isolated from other elements outside of the printer.

Certain system components and methods described herein may be implemented by way of non-transitory computer program code that is storable on a non-transitory storage medium. In some examples, a controller may comprise a non-transitory computer readable storage medium comprising a set of computer readable instructions stored thereon. The controller may further comprise at least one processor. Alternatively, one or more controllers may implement all or parts of the methods described herein. An example controller may control operations of the heating apparatus 100 and the apparatus 400. The controller may also additionally control other operations. For example, in examples where the apparatus 100, 400 are used within printing apparatus, the controller may also control certain printing operations.

Figure 5:
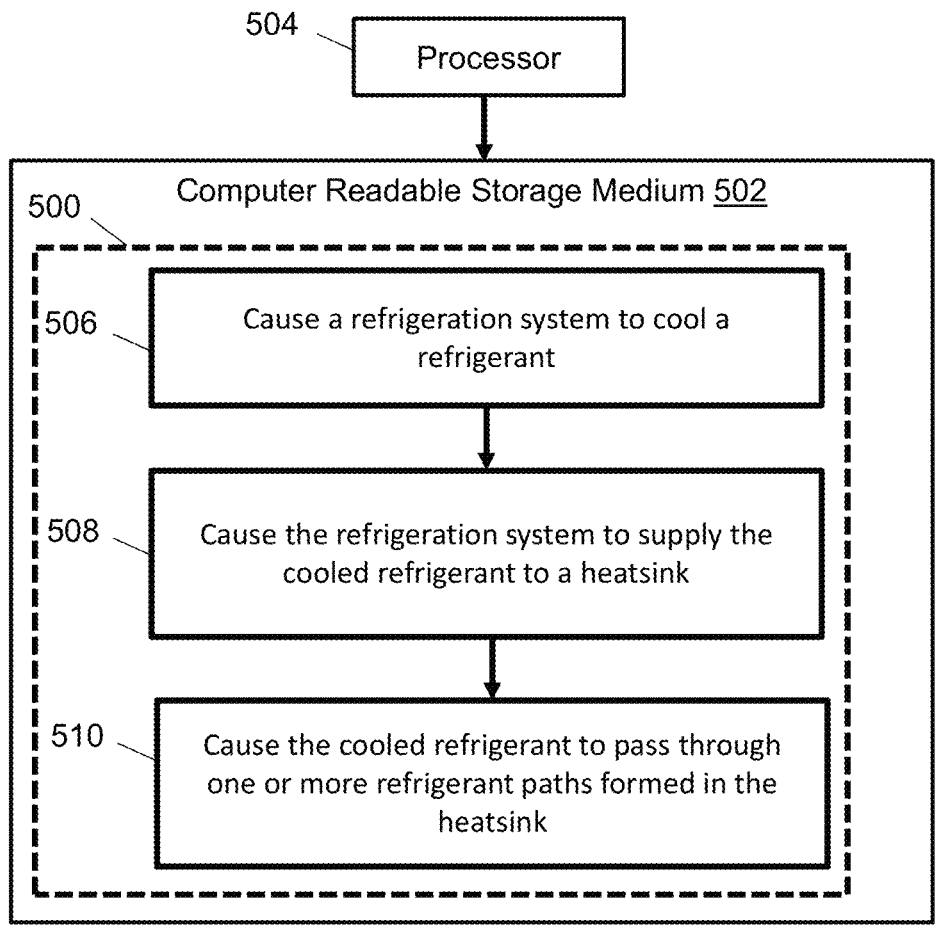
FIG. 5 is a schematic diagram of an example set of computer readable instructions within a non-transitory computer-readable storage medium.

FIG. 5 shows an example non-transitory computer readable storage medium 502 comprising a set of computer readable instructions 500 which, when executed by at least one processor 504, cause the processor 504 to perform a method according to examples described herein. The computer readable instructions 500 may be retrieved from a machine-readable media, e.g. any media that can contain, store, or maintain programs and data for use by or in connection with an instruction execution system. In this case, machine-readable media can comprise any one of many physical media such as, for example, electronic, magnetic, optical, electromagnetic, or semiconductor media. More specific examples of suitable machine-readable media include, but are not limited to, a hard drive, a random access memory (RAM), a read-only memory (ROM), an erasable programmable read-only memory, or a portable disc.

In one example, the non-transitory computer readable storage medium 502 comprises a set of computer-readable instructions 500 stored thereon, which, when executed by the processor 504, cause the processor 504 to, at block 506, cause a refrigeration system 402 to cool a refrigerant. For example, a controller initiates the cooling of the refrigerant by instructing the refrigeration system 402 to begin operating. Causing the refrigeration system 402 to cool the refrigerant may comprise sending an instruction to the refrigeration system 402 to switch on, or become active.

At block 508, the instructions 500 cause the processor 504 to cause the refrigeration system 402 to supply the cooled refrigerant 116 to the heatsink 108.

At block 510, the instructions 500 cause the processor 504 to cause the refrigeration system 402 to pass the cooled refrigerant 116 through one or more refrigerant paths 110 formed in the heatsink 108. As a result, heat from the LED array 102 that is thermally coupled to the heatsink 108, is transferred to the cooled refrigerant 116 via the heatsink 108.

Causing the refrigeration system 402 to supply the cooled refrigerant 116 to the heatsink 108 and pass the cooled refrigerant 116 through the refrigerant paths 110 may be separate operations, or they may be performed as part of the same operation described in block 506. For example, a single instruction to the refrigeration system 504 may cause operations in blocks 506, 510 and 510 to occur. In other words, initiating the cooling of the refrigerant in the refrigeration system 402 may result in the cooled refrigerant being passed through the refrigerant paths 110.

The instructions 500, when executed by the processor 504, may further cause the processor 504 to cause a flow of air 410 to be heated by the condenser 406 in the refrigeration system 402, wherein the flow of heated air 412 is supplied to a target 106 being heated by the LED array 102. This step may also be initiated as part of the previous steps discussed in blocks 506 to 510. For example the single instruction to cause the refrigeration system 402 to cool the refrigerant may also cause the flow of air 410 to be heated by the condenser 406. The instructions 500 may cause the flow of air to be heated by initiating fan 414. As mentioned above, further instructions may cause the heated air 412 to the directed towards or away from the target 106. For example, the decision to supply the heated air 412 towards the target 106 may depend on certain parameters, such as a temperature in the vicinity of the target 106, or the type/volume of ink deposited on the substrate.

Figure 6:
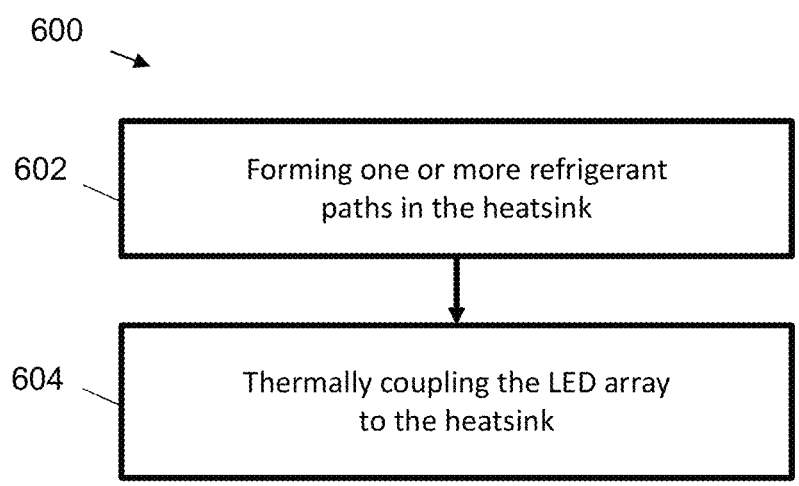
FIG. 6 is flow diagram illustrating a method of manufacturing a heating apparatus in accordance with an example.

FIG. 6 is a flow diagram showing a method 600. In one example the method 600 is a method of manufacturing a heating apparatus. In an example the heating apparatus comprises some, or all of the features described in the heating apparatus 100. In one example, the heating apparatus comprises an LED array 102 to heat a target object 106, and a heatsink 108. The method comprises, at block 602, forming one or more refrigerant paths 110 in the heatsink 108. In an example, forming the one or more refrigerant paths 110 comprises providing/forming one or more channels 304 in a surface 302 of the heatsink 108. In another example, forming the one or more refrigerant paths 110 comprises providing/forming one or more through holes 306 in the heatsink 108. In some examples, through holes 306 and channels 304 may both be provided in the heatsink 108 to form the refrigerant paths 110. The channels 304 and through holes 306 may be formed by any suitable means, such as drilling or boring. In one particular example, the heatsink 108 may be designed with the channels 304 and through holes 306 already formed within it. For example, the heatsink 108 may be moulded with through holes 306 or channels 304 within it, so that no material is subsequently removed to create the through holes 306 or channels 304.

The method further comprises, at block 604, thermally coupling the LED array 102 to the heatsink 108 to allow heat to be transferred from the LED array 102, via the heatsink 108, to refrigerant 116 passing along the one or more refrigerant paths 110. This step may also comprise mechanically coupling the LED array 102 to the heatsink 108. As mentioned above, the coupling may be direct or indirect.

The method may further comprise inserting one or more conduits 118 into the one or more through holes 306. For example, the conduits 118 may be passed within the heatsink 108. To allow the conduit 118 to be inserted into the through hole 304, the outer diameter of the conduit 118 must be less than the inner diameter of the through hole 306. Additionally, or alternatively, the method may comprise affixing, or placing a conduit 118 into a channel 304.

Figure 7A:
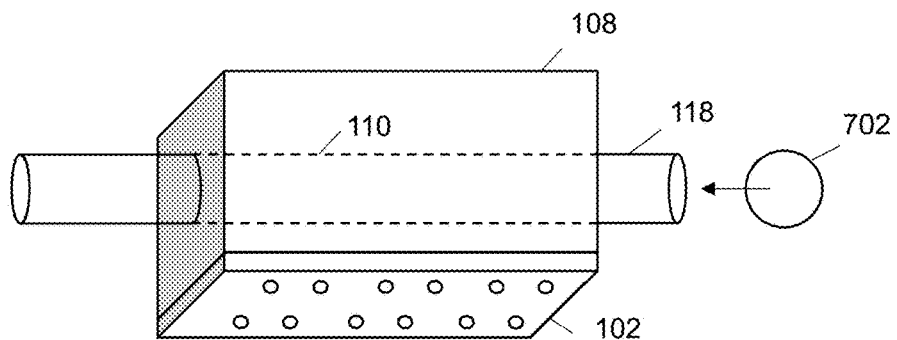
FIGS. 7A-C are schematic diagrams of a procedure for manufacturing a heating apparatus in accordance with an example.
Figure 7B:
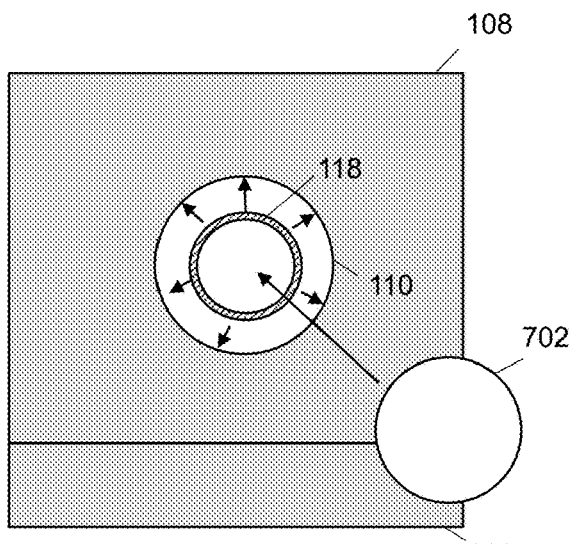
Figure 7C:
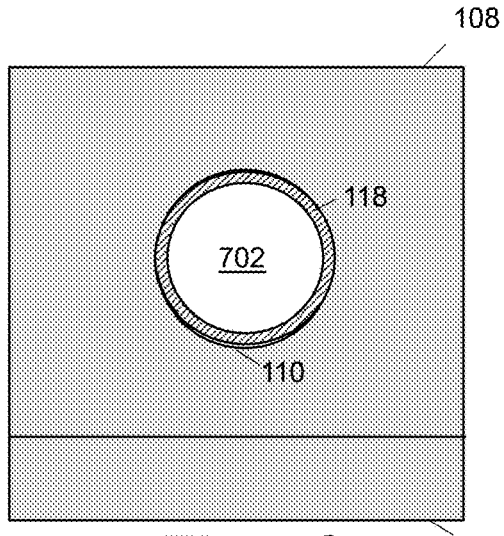

To ensure good thermal contact between the one or more conduits 108 and the heatsink 108, the method may further comprise passing an object 702 through the one or more conduits 118, where the object 702 has a diameter greater than a diameter of the one or more conduits 118 but no greater than the diameter of a respective through hole or channel. The object 702 is depicted in FIGS. 7A-C. In the example of FIGS. 7A-C, the object 702 is spherical in shape, however other shaped objects can be used. In one example, the object 702 may be a metal ball. Passing the object 702 through the one or more conduits 118 causes the diameter of the one or more conduits 118 to increase, and thereby increase the thermal coupling between the one or more conduits 118 and the heatsink 108. For example, FIGS. 7A and 7B show the object 702 before being inserted into the conduit 118. The diameter of the conduit 118 is shown in FIG. 7B as being smaller than the inner diameter of the through hole 306 (i.e. refrigerant path 110). Note that the difference in diameters is exaggerated for clarity. As the object 702 is inserted into the conduit 118, the conduit 118 is forced to expand outwards/radially. Arrows indicate the direction in which the diameter of the conduit 118 increases. FIG. 7C shows the object 702 in place as it has caused the conduit 118 to expand so that a greater proportion of the outer surface of the conduit 118 is in contact with the heatsink 108. This increases the thermal coupling between the heatsink 108 and the refrigerant 116 that passes through the conduit 118. The object 702 can then be removed. In one example the conduit 118 may be made from copper.

In one example, a printer, or printing device comprises the example heating apparatus 100 or the example apparatus 400. The printer or printing device may be an inkjet printer, a 3-d printer, or an electrophotographic printer for example.

What is claimed is:

1. A heating apparatus comprising:
   a light emitting diode (LED) array comprising an LED to heat a target object; and
   a heat sink thermally coupled to the LED array, to dissipate heat from the LED array, the heat sink comprising a plurality of refrigerant paths to pass a refrigerant through the heat sink in a plurality of different directions, wherein a refrigerant path of the plurality of refrigerant paths comprises a conduit that extends from outside the heat sink and that extends through an inner portion of the heat sink, wherein an outer surface of the conduit is in thermal contact with an inner surface of the heat sink.

2. The heating apparatus of claim 1, wherein a refrigerant path of the plurality of refrigerant paths comprises a through hole formed in the heat sink.

3. The heating apparatus of claim 1, wherein a refrigerant path of the plurality of refrigerant paths comprises a channel formed in a surface of the heat sink.

4. The heating apparatus of claim 1, wherein a refrigerant path of the plurality of refrigerant paths is curved within the heat sink.

5. The heating apparatus of claim 1, wherein a refrigerant path of the plurality of refrigerant paths extends in a zig-zag manner within the heat sink.

6. The heating apparatus of claim 1, wherein the plurality of refrigerant paths extends in a serpentine manner within the heat sink.

7. The heating apparatus of claim 1, wherein the plurality of refrigerant paths comprises a continuous conduit extending within the heat sink in a serpentine manner.

8. The heating apparatus of claim 1, wherein the LED array is attached to the heat sink through a thermally conductive layer.

9. The heating apparatus of claim 1, wherein the conduit is a single component that extends from outside the heat sink and that extends through the inner portion of the heat sink.

10. An assembly comprising:
    a light emitting diode (LED) array comprising an LED to heat a target object;
    a heat sink thermally coupled to the LED array, the heat sink comprising a plurality of refrigerant paths to pass a refrigerant through the heat sink in a plurality of different directions, wherein a refrigerant path of the plurality of refrigerant paths comprises a conduit that extends from outside the heat sink and that extends through an inner portion of the heat sink, wherein an outer surface of the conduit is in thermal contact with an inner surface of the heat sink; and
    a refrigeration system configured to:
       cool the refrigerant within the refrigeration system, and
       pass the cooled refrigerant through the plurality of refrigerant paths such that heat from the LED array is transferred to the cooled refrigerant via the heat sink.

11. The assembly of claim 10, wherein the conduit is connected between the refrigeration system and the heat sink.

12. The assembly of claim 10, wherein a refrigerant path of the plurality of refrigerant paths comprises a through hole formed in the heat sink.

13. The assembly of claim 10, wherein a refrigerant path of the plurality of refrigerant paths comprises a channel formed in a surface of the heat sink.

14. The assembly of claim 10, wherein the conduit is curved within the heat sink.

15. The assembly of claim 10, wherein the conduit extends in a zig-zag manner within the heat sink.

16. The assembly of claim 10, wherein the plurality of refrigerant paths extends in a serpentine manner within the heat sink.

17. The assembly of claim 16, wherein the plurality of refrigerant paths comprises a continuous through hole extending within the heat sink in a serpentine manner.

18. The assembly of claim 10, wherein the refrigeration system comprises:
    a condenser to condense the refrigerant using air, and
    a fan to direct heated air caused by the condensing of the refrigerant to the target object.

19. The assembly of claim 18, wherein the refrigeration system further comprises compressor to compress the refrigerant and to provide the compressed refrigerant to the condenser.

20. The assembly of claim 19, wherein the refrigeration system further comprises an expansion valve to expand the condensed refrigerant output by the condenser.

* * * * *